(12) United States Patent
Shirahama

(10) Patent No.: US 9,905,740 B2
(45) Date of Patent: Feb. 27, 2018

(54) LIGHT EMITTING DEVICE AND METHOD OF MANUFACTURING THE SAME

(71) Applicant: NICHIA CORPORATION, Anan-shi (JP)

(72) Inventor: Satoshi Shirahama, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/975,860

(22) Filed: Dec. 21, 2015

(65) Prior Publication Data

US 2016/0190395 A1 Jun. 30, 2016

(30) Foreign Application Priority Data

Dec. 26, 2014 (JP) ................. 2014-266014

(51) Int. Cl.
| | |
|---|---|
| *H01L 33/62* | (2010.01) |
| *H01L 33/60* | (2010.01) |
| *H01L 33/48* | (2010.01) |
| *H05K 3/34* | (2006.01) |

(52) U.S. Cl.
CPC ............ *H01L 33/60* (2013.01); *H01L 33/486* (2013.01); *H05K 3/3431* (2013.01); *H01L 2933/0033* (2013.01); *H05K 2201/10106* (2013.01); *H05K 2201/10234* (2013.01); *Y02P 70/613* (2015.11)

(58) Field of Classification Search
CPC ........................................................ H01L 33/62
See application file for complete search history.

(56) References Cited

U.S. PATENT DOCUMENTS

| | | | |
|---|---|---|---|
| 2009/0095969 A1 | 4/2009 | Kotani et al. | |
| 2010/0264453 A1* | 10/2010 | Wang | ...................... H01L 24/03 257/99 |
| 2013/0001633 A1* | 1/2013 | Imai | ........................ H01L 33/60 257/99 |
| 2013/0299864 A1 | 11/2013 | Sugizaki et al. | |
| 2014/0217438 A1* | 8/2014 | Tomizawa | ............ H01L 33/486 257/98 |

FOREIGN PATENT DOCUMENTS

| | | |
|---|---|---|
| JP | 6-97325 | 4/1996 |
| JP | 2010-21507 | 1/2010 |
| JP | 2012-146898 | 8/2012 |
| JP | 2014-150196 | 8/2014 |

\* cited by examiner

*Primary Examiner* — Peniel M Gumedzoe
*Assistant Examiner* — Christopher Johnson
(74) *Attorney, Agent, or Firm* — Mori & Ward, LLP

(57) ABSTRACT

A light emitting device includes a light emitting element, a light-reflecting substrate, and an electrically conductive member. The light emitting element includes a first surface and an electrode provided on the first surface. The light-reflecting substrate has a first main surface facing the first surface of the light emitting element and has a second main surface opposite to the first main surface. The light-reflecting substrate defines a hole at a position corresponding to the electrode. The hole penetrates through the light-reflecting substrate from the first main surface to the second main surface. The electrically conductive member includes a substantially spherical core arranged in the hole and bonded with the electrode, and a coating portion provided in a space between the substantially spherical core and a lateral surface of the hole.

14 Claims, 6 Drawing Sheets

LIGHT EMITTING DEVICE AND METHOD OF MANUFACTURING THE SAME

CROSS-REFERENCE TO RELATED APPLICATIONS

The present application claims priority under 35 U.S.C. § 119 to Japanese Patent Application No. 2014-266014, filed Dec. 26, 2014. The contents of this application are incorporated herein by reference in their entirety.

BACKGROUND

Technical Field

The present disclosure relates to a light emitting device and a method of manufacturing a light emitting device.

Discussion of the Background

Light emitting diodes (LED) have a lot of merits such as low power consumption, long life and high reliability, and are utilized widely for various purposes including various kinds of lightings, light sources for back lights and the like. As a light emitting device using such an LED, a small-sized chip size package (CSP) type light emitting device as disclosed in Japanese Unexamined Patent Application Publication No. 2012-146898 has been known.

The light emitting device described in Japanese Unexamined Patent Application Publication No. 2012-146898 includes: a semiconductor layer; a p-side electrode and an n-side electrode; a p-side wiring layer and an n-side wiring layer; and insulating layer that insulates the respective wiring layers, in which the respective wiring layers are exposed as external terminals from plural surfaces of the insulating layer. According to such a configuration, the small-sized light emitting device with high mountability can be produced.

However, such electrodes and wiring layers described above are typically produced by way of plating or the like, which requires time and costs, and may result in reduction in the efficiency of the production.

SUMMARY OF THE INVENTION

According to a first aspect of the present invention, a light emitting device includes a light emitting element, a light-reflecting substrate, and an electrically conductive member. The light emitting element includes a first surface and an electrode provided on the first surface. The light-reflecting substrate has a first main surface facing the first surface of the light emitting element and has a second main surface opposite to the first main surface. The light-reflecting substrate defines a hole at a position corresponding to the electrode. The hole penetrates through the light-reflecting substrate from the first main surface to the second main surface. The electrically conductive member includes a substantially spherical core arranged in the hole and bonded with the electrode, and a coating portion provided in a space between the substantially spherical core and a lateral surface of the hole.

According to a second aspect of the present invention, a method of manufacturing a light emitting device includes providing a light emitting element including a first surface and having an electrode on the first surface, providing a light-reflecting substrate having a first main surface and a second main surface opposite to the first main surface and defining a hole penetrating from the first main surface to the second main surface of the light-reflecting substrate at a location corresponding to the electrode, providing a substantially spherical electrically conductive member, arranging the first surface of the light emitting element and the first main surface of the light-reflecting substrate so that the electrode is exposed in the hole, arranging the substantially spherical electrically conductive member in the hole, and bonding the substantially spherical electrically conductive member with the electrode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
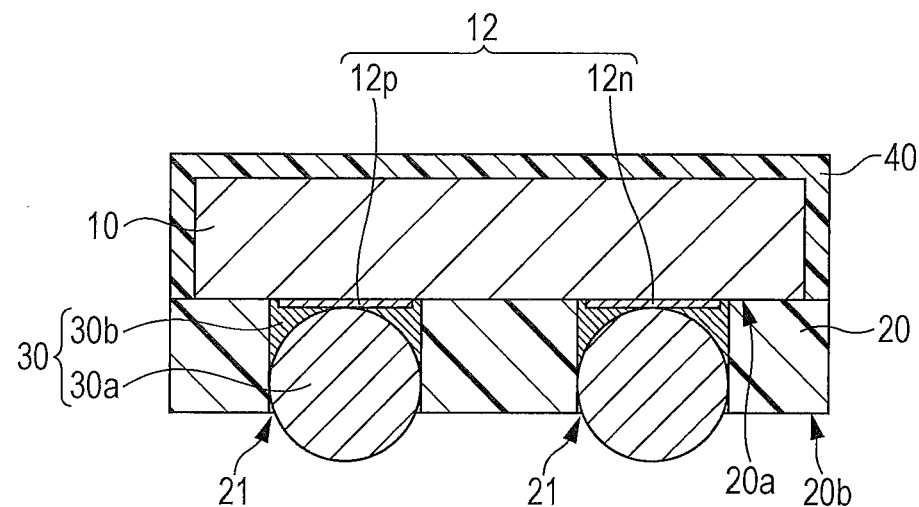
FIG. 1 is a schematic cross-sectional view of a light emitting device 100A according to a first embodiment.

The embodiments will now be described with reference to the accompanying drawings, wherein like reference numerals designate corresponding or identical elements throughout the various drawings.

The embodiments of the present invention will be described below with reference to the accompanying drawings as appropriate. The embodiments shown below are intended as illustrative to give a concrete form to technical ideas of the present invention, and the scope of the present invention is not limited to those described below. Particularly, sizes, materials, shapes, positional relationships and the like of the constituent members do not limit the technical scope of the present invention, but are solely examples for the explanation. In addition, sizes, positional relationships and the like of the members that are illustrated in each of the drawings may be exaggerated for the clearer explanation. The embodiments described below can be applied by combining the respective structures and the like as appropriate.

First Embodiment

Light Emitting Device

FIG. 1 is a schematic cross-sectional view of a light emitting device 100A according to a first embodiment. The light emitting device 100A includes a light emitting element 10 that includes a first surface and has positive and negative electrodes 12p and 12n on the first surface side. Further, the light emitting element 10 is provided with a light-reflecting substrate 20 on the first surface side having the electrodes 12. The light-reflecting substrate 20 includes a first main surface 20a that faces the first surface of the light emitting element 10 having the electrodes 12 and a second main surface 20b that is opposite to the first main surface 20a. Moreover, the light-reflecting substrate 20 defines holes 21 penetrating through the light-reflecting substrate 20 from the first main surface 20a to the second main surface 20b (that is, penetrating through the light-reflecting substrate 20 in its thickness direction) at positions that correspond to the electrodes 12, respectively. Each of the electrodes 12 of the light emitting element 10 is exposed in each of the holes 21.

In each of the holes 21, an electrically conductive member 30 is arranged. The electrically conductive members 30 are terminals that supply a current from an outside to the light emitting device 100A. The electrically conductive members 30 include substantially spherical cores 30a that are bonded with the electrodes 12 and coating portions 30b that are filled so as to fill the spaces between the cores 30a and the surfaces of the light-reflecting substrates 20 defining the holes 21, respectively. In the present embodiment, the coating portions 30b serve as adhesive members, bonding the electrodes 12 of the light emitting element 10 with the cores 30a, respectively.

In more detail, in the present embodiment, the first main surfaces 20a and the second main surfaces 20b of the light-reflecting substrate 20 are substantially planar, and the surfaces 22 of the light-reflecting substrate defining the holes 21 are substantially perpendicular to the first main surfaces 20a and the second main surfaces 20b of the light-reflecting substrate 20. The contour of the openings of the holes 21 in the first main surface 20a and in the second main surface 20b have substantially circular shapes with substantially the same diameter. Thus, the holes 21 of the present embodiment have substantially cylindrical shapes.

Further, in a plan view, the holes 21 of the present embodiment are larger in diameter than the corresponding electrodes 12 of the light emitting element 10, and the electrodes 12 are disposed within the holes 21, respectively. Moreover, the diameters of the holes 21 are substantially equal to the diameters of the corresponding cores 30a, and the surfaces 22 of the light-reflecting substrate that define the holes 21 are directly in contact with the corresponding cores 30a. The diameters of the cores 30a are larger than a thickness of the light-reflecting substrate 20, and the cores 30a protrude from the second main surface 20b. In the present embodiment, the coating portions 30b are filled to the levels that are less than the plane of the second main surface 20b.

The configurations described above are advantageous as described below. First, such electrically conductive members 30 having the cores 30a and the coating portions 30b as described above can save manufacturing costs and time more than those of electrically conductive members which are produced by way of plating or the like. Further, with the use of the light-reflecting substrate 20 with the holes 21, the light emitting device 100A can be produced easily. More specifically, as compared with the case of forming a light reflecting substrate where the electrically conductive members are bonded with the light emitting element and then a resin containing a light-reflecting material is applied to enclose the electrically conductive members and forms the light-reflecting substrate, the case of using the light-reflecting substrate defining the holes does not require high precision in positioning the electrically conductive members 30 with the electrodes 12 of the light emitting element 10, so that manufacturing of the light emitting device 100A can be facilitated. Moreover, a step of exposing the electrically conductive members can be omitted, allowing a reduction in the manufacturing costs.

Next, in a plan view, the electrodes 12 are accommodated within the respective holes 21, so that steps formed between the semiconductor layer 11 and the electrodes 12 can also be located within the holes 21. Thus, the light emitting element 10 and the light-reflecting substrate 20 can be arranged without spaces. Further, the surfaces 22 of the light-reflecting substrate 20 that define holes 21 contact the cores 30a, so that the light-reflecting substrate 20 and the cores 30a are fixed with each other. The cores 30a are bonded with the electrodes 12 of the light emitting element 10, and thus, the light-reflecting substrate 20 and the light emitting element 10 can be fixed with each other. Moreover, in the case of mounting the light emitting device 100A further on a wiring board, the cores 30a can be bonded with the electrodes 12 and the wiring board securely with the use of the cores 30a having diameters that are larger than the thickness of the light-reflecting substrate 20. Further, the cores 30a protrude from the second main surface 20b, which facilitates mounting of the light emitting device 100A Furthermore, the coating portions 30b are filled to the levels that are less than the plane of the second main surface 20b, the coating portions 30b are hardly leaked to outsides of the holes 21, so that malfunction such as a short circuit of the light emitting device 100A can be prevented.

As described above, the light emitting device 100A of small size and high reliability can be manufactured easily with high production efficiency.

The light emitting device 100A of the present embodiment is used as a top-view type light emitting device that has a light emitting surface opposite to the first surface having the electrodes 12, and a mounting surface that is the second main surface 20b of the light-reflecting substrate 20 from which the electrically conductive members 30 are exposed. The light emitting device 100A of the present embodiment can also be used as a side-view type light emitting device. A side-view type light emitting device 100A can be obtained by, for example, providing the holes 21, from which the electrically conductive members 30 are exposed, also on side surfaces of the light reflecting substrate 20 (that is, the surfaces of the light reflecting substrate 20 other than the first main surface 20a or the second main surface 20b), the light emitting device 100A can be the side-view type.

Hereinafter, preferred embodiments of the respective constituent members of the light emitting device 100A will be described.

Light Emitting Element

As the light emitting element 10, a semiconductor light emitting element such as an LED element and an LD element can be used. Materials, structures and the like of the light emitting element 10 can be selected appropriately so that the light emitting element 10 includes at least the semiconductor layer 11 and the positive and negative electrodes 12, and the positive and negative electrodes 12 are formed on the same surface side. Further, the light emitting device 100A may have a plurality of the light emitting elements.

The first surface of the light emitting element 10 having the electrodes 12 preferably has less steps (except for the steps between the semiconductor layer 11 and the electrodes 12). Thereby, the light emitting element 10 and the light-reflecting substrate 20 can be arranged with no space.

The semiconductor layer 11 may include an n-type semiconductor layer 11a, a light emitting layer 11b, and a p-type semiconductor layer 11c layered in this order. For the semiconductor layer 11, a nitride semiconductor such as $In_xAl_yGa_{1-x-y}N$ ($0 \leq x$, $0 \leq y$, $x+y<1$) can be suitably used. Other semiconductors such as a gallium arsenide-based or gallium phosphide-based semiconductor to emit green to red light may be used. Each of the layers of the semiconductor layer 11 may have a single layer structure, or may have a layered structure of layers with different compositions, thicknesses or the like, a superlattice structure or the like. Particularly, the light emitting layer 11b preferably has a single quantum well structure or a multiquantum well structure.

The positive and negative electrodes 12 are for supplying a current from the outside to the light emitting element 10, and includes an n-side electrode 12n that is electrically connected with the n-type semiconductor layer 11a and a p-side electrode 12p that is electrically connected with the p-type semiconductor layer 11c. Shapes of the electrodes 12 can be appropriately selected, which may be a circle, a square, a polygon and the like in a plan view. The electrodes 12 can be made of a metal material, for example, a single metal such as Ag, Al, Ni, Rh, Au, Ti, Pt and W, or an alloy thereof. Those metal materials can be used as a single layer or as a multilayer.

The light emitting element 10 may also include a substrate for growth of the semiconductor layer 11 or the like as appropriate. As a material for the substrate, a light-transmissive substrate is particularly preferable. For example, in the case of forming the semiconductor layer 11 of a nitride semiconductor such as GaN, examples thereof include an insulating substrate such as sapphire and spinel ($MgAl_2O_4$), SiC, ZnS, ZnO, Si, GaAs, diamond, and oxide substrates such as lithium niobate, neodymium gallate and the like which make lattice bonding with the nitride semiconductor.

Moreover, the light emitting element 10 may also include a conductor layer for dispersing electric current uniformly throughout the entire surface of each layer of the semiconductor layer 11, and an insulating protective film or the like that coats a portion of the electrode 12 and/or a portion of the semiconductor layer 11 so as to prevent migration of the electrodes 12 or the like. With the presence of the protective film, bonding between the light emitting element 10 and the light-reflecting substrate 20 can be facilitated. For a material of the conductor layer, a light-transmissive conductive metal oxide, a metal thin film of a laminate of Au and Ni, and the like are preferable, and particularly, ITO that exhibits high light-transmittance in a visible light region is preferably used. For a material of the protective film, an oxide of at least one element selected from the group consisting of Si, Ti and Ta, SiN and the like can be used.

Light-Reflecting Substrate

The light-reflecting substrate 20 includes a first main surface 20a that faces the surface of the light emitting element 10 having the electrodes 12, a second main surface 20b that is opposite to the first main surface 20a, and the holes 21 which penetrate the light-reflecting substrate 20 from the first main surface 20a to the second main surface 20b at the positions that correspond to the electrodes 12 of the light emitting element 10. The material, configuration, or the like of the light-reflecting substrate 20 can be appropriately selected so that the light-reflecting substrate 20 is made of the material and a thickness that can reflect light of the light emitting element 10. In the present specification, the expression "positions that correspond to the electrodes 12" refers to positions of the light-reflecting substrate 20 which can expose at least a part of each of the positive and negative electrodes 12p and 12n, when the surface of the light emitting element 10 having the electrodes 12 is superposed on the first main surface 20a of the light-reflecting substrate 20. That is, a separation distance between the holes 21 is preferably adjusted according to the separation distance between the respective electrodes 12 of the light emitting element 10. In the case where the one light emitting element has plural sets of the positive and negative electrodes, the light-reflecting substrate is required to have the holes that can expose at least one set of the positive and negative electrodes respectively. In the case where the light emitting device has a plurality of the light emitting elements, the light-reflecting substrate that has plural sets of the pair of holes which correspond to the respective electrodes can be used.

The first main surface 20a of the light-reflecting substrate 20 preferably has a shape that hardly generates a space, when the first main surface 20a of the light-reflecting substrate 20 is superposed on the light emitting element 10 having the electrodes 12. That is, the first main surface 20a preferably has a shape that fits with the surface of the light emitting element 10 having the electrodes 12, and the shape preferably has, for example, irregularities around the holes 21 so as to correspond to the semiconductor layer 11. Accordingly, leakage of light of the light emitting element 10 through the space can be prevented. Also, outflow of the coating portions 30b from the holes 21 can be prevented.

Further, the lateral surfaces 22 of the holes 21 of the present embodiment are substantially perpendicular to the first main surface 20a and the second main surface 20b of the light-reflecting substrate 20, but are not limited to this. For example, each of the lateral surfaces 22 of the holes 21 can be selected as appropriate from an inclined surface, a curved surface, an irregular surface and the like. The second and third embodiments will provide a form which uses a light-reflecting substrate having holes whose shapes are different from the shapes of the holes 21 of the first embodiment.

In addition, an appropriate processing may be applied on the lateral surfaces 22 of the holes 21 so as to enhance the bonding strength between the lateral surfaces 22 and the electrically conductive members 30. Examples of such processing include providing coating films or irregularities onto the lateral surfaces 22, and providing roughness on the lateral surfaces 22. For example, in the case where the coating portions 30b of the electrically conductive members 30 are made of solder or the like, if the lateral surfaces 22 of the holes 21 are provided with coating films of metal that has favorable wettability with the coating portions 30b by plating or the like, adhesiveness between the coating portions 30b and the light-reflecting substrate 20 can be improved, so that the fixation of the light emitting element 10, the electrically conductive members 30 and the light-reflecting substrate 20 can be strengthened accordingly. The form of the lateral surfaces 22 having the irregularities or the roughen surfaces will be described in detail in the third embodiment.

The opening area of each hole 21 at the first main surface is preferably formed with an opening diameter so that in a plan view the hole is nearly equal to or larger than the area of the corresponding electrode 12 of the light emitting element 10, as in the present embodiment. The term "opening diameter" of the hole 21 refers to a diameter of the hole 21 at the first main surface 20a or at the second main surface 20b. With this arrangement, each of the electrodes 12 can be exposed in the corresponding hole 21, with an area sufficient to connect with the electrically conductive member 30. Further, at least the steps of the electrodes 12 can be arranged within the holes 21, which allows for reduction of the gap between the first surface provided with the electrodes 12 of the light emitting element 10 and the first main surface 20a of the light-reflecting substrate 20, thus, the light emitting element 10 and the light-reflecting substrate 20 can be stably superposed one upon another.

The opening diameters of the holes 21 may be smaller than the electrodes 12 of the light emitting element 10 in a plan view. Further, wholes of the electrodes 12 may not be necessarily arranged in the holes 21. That is, the light-reflecting substrate 20 may be arranged on a part of the electrode 12. Moreover, the shape of the opening of the hole 21 may be selected as appropriate from a circle, a square, a polygon and the like in a plan view.

The light-reflecting substrate 20 is preferably made of a material that can shield light of the light emitting element 10. Particularly, it is preferably made of a material having reflectance in a range of about 60% to 90% or more with respect to light emitted from the light emitting element 10. Further, it is preferable that the material hardly absorbs light of the light emitting element 10.

As the light-reflecting substrate 20, for example, a base material of resin, a ceramic or the like in which a light-reflecting matter is mixed can be used. Examples of such a resin includes a thermosetting resin, a thermoplastic resin, a modified resin of those, a hybrid resin containing at least one kind or more of them. Specific examples thereof include an epoxy resin, a modified epoxy resin (silicone-modified epoxy resin or the like), a silicone resin, a modified silicone resin (epoxy-modified silicone resin or the like), a hybrid silicone resin, an unsaturated polyester resin, a polyimide resin, a modified polyimide resin, a polyamide resin, a polyethylene terephthalate resin, a polybutylene terephthalate resin, a polycyclohexane terephthalate resin, a polyphthalamide (PPA), a polycarbonate resin, a polyphenylene sulfide (PPS), a liquid crystal polymer (LCP), an ABS resin, a phenol resin, an acrylic resin, a PBT resin, an urea resin, a BT resin, a polyurethane resin. Particularly, in view of heat resistance, modified epoxy resin, modified silicone resin and liquid crystal polymer are preferable.

As the light-reflecting matter, titanium dioxide, silicon dioxide, zirconium dioxide, potassium titanate, alumina, aluminum nitride, silicon nitride, boron nitride, mullite, niobium oxide, zinc oxide, barium sulfate, various kinds of rare earth oxide (for example, yttrium oxide and gadolinium oxide) and the like are exemplified. The light-reflecting matter is preferably contained by about 20% to about 80% by weight, and is more preferably contained by about 30% to about 50% by weight with respect to a total weight of the light-reflecting substrate 20. With this arrangement, optical reflectance of the light-reflecting substrate 20 can be increased while securing strength. The light-reflecting substrate 20 may further contain filler, a diffusing material, a wavelength conversion member, a coloring material or the like.

Electrically Conductive Member

In the present embodiment, the electrically conductive members 30 each contains a substantially spherical core 30a that is bonded with the electrode 12 exposed in the hole 21, and a coating portion 30b that is filled in the hole 21 so as to fill the space between the core 30a and the lateral surface 22 of the hole 21. Each of the cores 30a may be either exposed from the coating portions 30b or substantially entirely coated by the coating portion 30b.

Core

The cores 30a preferably have diameters that is not greater than the diameters of the holes 21 in a plan view so that the cores 30a can be bonded with the respective electrodes 12, respectively. Particularly, in the case where the cores 30a have diameters substantially equal to the diameters of the holes 21 in a plan view, the cores 30a can be in contact with the lateral surfaces 22 of the holes 21, so that the cores 30a can be fixed with the light-reflecting substrate 20. The cores 30a are bonded with the electrodes 12 of the light emitting element 10, so that the light-reflecting substrate 20 and the light emitting element 10 can be fixed with each other. In the case where the diameters of the cores 30a are in a range of about 50% to 95% or greater with respect to the diameters of the holes 21 in a plan view, the cores 30a and the electrodes 12 can be suitably bonded.

Further, the cores 30a preferably have diameters equal to or greater than the thickness of the light-reflecting substrate 20, so that outermost portion of the cores 30a can be located in an approximately same plane with the second main surface 20b or can be protruded from the second main surface 20b. For example, the cores 30a can be protruded from the second main surface 20b by about 10 μm to about 100 μm. With this arrangement, the cores 30a can be bonded securely with the wiring board on which the electrodes 12 of the light emitting element 10 and the light emitting device 100A are mounted. More specifically, in the case where the cores have diameters smaller than the thickness of the light-reflecting substrate, the cores that are bonded with the electrodes of the light emitting device may move toward the wiring board due to heat or the like that is applied while mounting the light emitting device on the wiring board. On the other hand, in the case where the light emitting device 100A has the cores 30a whose diameters are equal to or larger than the thickness of the light-reflecting substrate 20 as in the present embodiment, each of the cores 30a can be tightly held between the electrode 12 and the wiring substrate, so that the core does not move and accordingly the cores 30a can be bonded with both of the electrodes 12 and the wiring substrate securely. With this arrangement, favorable heat dissipation path can be secured. In addition, the light emitting device 100A can have the high mountability.

The cores 30a may have appropriate diameters so as to be bonded with the electrodes 12. For example, the cores 30a may have diameters greater than the diameters of the holes 21 in a plan view, or may have diameters smaller than the thickness of the light-reflecting substrate 20. In the present embodiment, the cores 30a have substantially spherical shapes whose cross-sections are substantially circular, but the cores 30a may have appropriate shapes that allows for bonding with the electrodes 12. In the present specification, the term "substantially spherical shape" may not refer to an outer shape with a curved surface.

Further, in the present embodiment, a single core 30a is arranged in a single hole 21, but a plurality of the cores 30a may be arranged in a single hole 21. With this arrangement, the heat releasing property can further be improved.

The cores 30a are made of an electrically conductive material and a metal or the like can be suitably used. More specifically, the material preferably contains Cu as its main component (more specifically, a content of Cu is about 50% by mass or more). Particularly, it is preferable that the content of Cu is about 99% by mass or more, or that the material is an alloy of Cu with at least one metal selected from Zn, Sn, P, Ni, Au, Mo and W, due to good thermal conductivity and electrical conductivity. The diameters of the cores 30a, which are determined depending on the sizes of the holes 21, may be in a range of about 1 μm to about 1000 μm, and more preferably in a range of about 40 μm to about 200 μm.

Coating Portion

The coating portions 30b are preferably disposed in amounts sufficient to fill the corresponding holes 21, in which the cores 30a are arranged respectively, to a certain level. Further, the coating portions 30b are preferably disposed in amounts that allow the coating portions 30b to remain in the holes 21 by their surface tension during melting so that the shapes of the electrically conductive members 30 can be maintained. More specifically, about 50% to about 95% of the space between the core 30a and the side surface of the hole 21 is preferably filled with the coating portion 30b. With this arrangement, the light emitting element 10 can be bonded with the cores 30a at sufficient strength. Moreover, with this arrangement, the coating portions 30b scarcely overflow from the holes 21, so that occurrence of short circuit of the light emitting device 100A can be prevented.

For the coating portions 30b, an electrically conductive material can be used favorably, but in the case where electrical conduction between the cores 30a and the electrodes 12 of the light emitting element 10 can be obtained by, for example, directly contacting each other, an electrically insulating material may also be used.

As the electrically conductive material, solder is particularly preferable, but conductive paste made of Ag, Au, Pd or the like may also be used. As the solder, alloy that contains Au and at least one kind among Si, Ge and Sn is preferably used. Other than these, Ni, Ni—B, Ni—P or the like may be used. As described above, if the coating portions 30b are made of such an electrically conductive material, even when the cores 30a do not directly contact the electrodes 12 of the light emitting element 10, the light emitting element 10 can be conducted electrically with the electrically conductive members 30. Further, favorable adhesion with the electrodes 12 of the light emitting element 10 can be obtained with the materials described above, as compared with other electrically conductive materials such as electrically conductive resins, so that the adhesion between the light emitting element 10 and the electrically conductive members 30 can be improved.

Examples of electrically insulating materials include, electrically insulating resin and the like are exemplified. The resin may contain filler, a light-reflecting material, a diffusing material, a coloring material, a wavelength conversion member or the like. It is preferable that the resin preferably has optical reflectivity, because the resin having optical reflectivity can reflect light of the light emitting element 10 in a light emitting direction of the light emitting device 100A. The coating portions 30b made of the electrically insulating material such as the resin can adhere to the light-reflecting substrate 20 more favorably than the above-described electrically conductive materials, whereby the adhesiveness between the light-reflecting substrate 20 and the electrically conductive members 30 can be improved. Further, in the case where the coating portions 30b are made of such an electrically insulating material, even if the coating portions 30b overflow from the holes 21, malfunction such as a short circuit of the light emitting device 100A does not occur.

Light-Transmissive Member

The light emitting device 100A may have a light-transmissive member 40 that can transmit light of the light emitting element 10, on surfaces of the light emitting element 10 from which light of the light emitting element 10 is taken out, as shown in FIG. 1. With this arrangement, the surfaces of the light emitting element 10 can be protected. Also, the light emitting device 100A can have desired light distribution.

The light-transmissive member 40 is not necessarily provided on all of the surfaces of the light emitting element 10 from which light of the light emitting element 10 is taken out, and may be provided on only a part thereof. Also, the light-transmissive member 40 may be provided on a part other than the surfaces of the light emitting element 10. For example, the light-transmissive member 40 can be provided on the light-reflecting substrate 20, or if there is the space between the light emitting element 10 and the light-reflecting substrate 20, the light-transmissive member 40 can be provided in the space or the like.

A shape of the light-transmissive member 40 can be freely selected as appropriate from a film, a dome, a board and the like, and may be composed of plural layers. Further, a surface of the light-transmissive member 40 can be selected as appropriate from a flat plane, a curved surface, an inclined surface, an irregular surface and the like.

The light-transmissive member 40 is preferably made of a light-transmissive base material that contains a wavelength conversion member. With this arrangement, the light emitting device 100A can emit light in desired color. As a material for the base material, resin, an inorganic matter such as glass or the like can be used. As the resin, resin materials that are similar to the above-described materials for the light-reflecting substrate 20 can be used. Particularly, in the light of the light-transmittance, heat resistance and light resistance, silicone resin is preferable.

As the wavelength conversion member, for example, a phosphor that is known in the related art can be used. Specific examples thereof include, a yttrium aluminum garnet (YAG) based phosphor activated with cerium, a lutetium aluminum garnet (LAG) based phosphor activated with cerium, a nitrogen-containing calcium aluminosilicate ($CaO$—$Al_2O_3$—$SiO_2$) based phosphor activated with europium and/or chromium, a silicate ($(Sr, Ba)_2SiO_4$) based phosphor activated with europium, a β-sialon phosphor, a nitride based phosphor such as a CASN based or SCASN based phosphor, a KSF based phosphor (K$_2$SiF$_6$; Mn), a sulfide based phosphor, and the like. The wavelength conversion member may also be made of, for example, so-called nanocrystal and a light emitting matter called quantum dots. As the material, a semiconductor material can be used as the semiconductor material, and more specifically, II-VI, III-V and IV-VI semiconductors can be used. Specific examples thereof include nano-sized highly dispersible particles of CdSe, core-shell CdS$_x$Se$_{1-x}$/ZnS, GaP and the like.

The wavelength conversion member may be distributed unevenly in the light-transmissive member 40. Further, the light-transmissive member 40 may include only wavelength conversion member, or may not necessarily include the wavelength conversion member. The light-transmissive member 40 may further contain filler, a light-reflecting material, a diffusing material, a coloring material or the like.

Light Emitting Module

Figure 9:
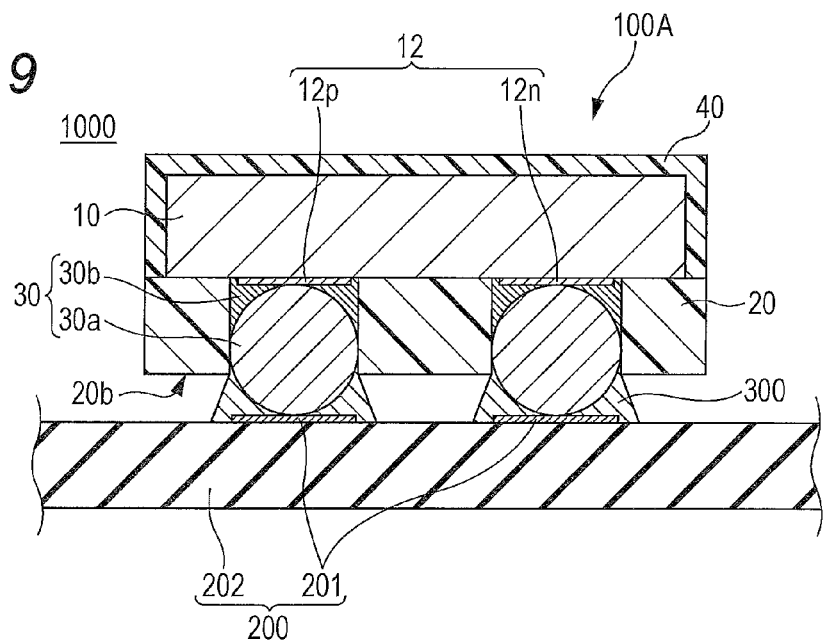
FIG. 9 is a schematic cross-sectional view of a light emitting module 1000 in which the light emitting device 100A according to the first embodiment is mounted on a wiring board 200.

FIG. 9 is a schematic cross-sectional view of a light emitting module 1000 in which the light emitting device 100A according to the first embodiment is mounted on a wiring board 200. In the present embodiment, the light emitting device 100A is flip-chip mounted on the wiring board 200 so that the second main surface 20*b* of the light-reflecting substrate 20 from which the electrically conductive members 30 are exposed may face the wiring board 200. The light emitting module 1000 includes at least the light emitting device 100A, the wiring board 200 and an adhesive 300 for bonding the light emitting device 100A with the wiring board 200.

Wiring Board

The wiring board 200 is a mounting substrate on which the light emitting device 100A is mounted. The wiring board 200 has, on at least an upper surface thereof, positive and negative wirings 201 at positions that correspond to the electrically conductive members 30 of the light emitting device 100A. The wiring board 200 may include only the wirings 201, but may also have a base member 202 that insulates the positive and negative wirings 201 from each other.

As a material for the wirings 201, a material having high electrical conductivity is favorably used, and examples thereof include metal materials such as Cu, Ni, Pd, W, Cr, Ti, Al, Ag, Au and alloy of them. In the light of the heat releasing property, the material for the wirings 201 is particularly preferably Cu or Cu alloy. Further, on surfaces of the wirings 201, coating films made of Au, Pt, Sn, Ag, Cu, Rh or alloy of them may be formed. Also, the wirings 201 may have coating films of oxide which are obtained by oxidizing the surfaces of the wirings made of Ag or Ag alloy.

As a material for the base member 202, insulating materials such as a ceramic, glass epoxy and resin are exemplified. Particularly, a ceramic that has high heat resistance and weather resistance is preferable. As the ceramic material, alumina, aluminum nitride, mullite and the like are preferably used, and LTCC may also be used. Other than these, an insulating base member obtained by coating a surface of a metal material with the insulating material can also be used.

Adhesive

The adhesive 300 is for allowing the light emitting device 100A to adhere to the wiring board 200. More specifically, the adhesive 300 is arranged on the wirings 201 of the wiring board 200 by application, printing or the like in advance, and the electrically conductive members 30 of the light emitting device 100A are arranged thereon, to which heat is subsequently applied, whereby the wirings 201 can be bonded with the electrically conductive members 30.

Examples of the adhesive 300 include: Sn—Bi, Sn—Cu, Sn—Ag and Au—Sn solder (more specifically, alloy that contains Ag, Cu and Sn as its main components, alloy that contains Cu and Sn as its main components, alloy that contains Bi and Sn as its main components and the like); eutectic alloy (more specifically, alloy that contains Au and Sn as its main components, alloy that contains Au and Si as its main components, alloy that contains Au and Ge as its main components and the like); conductive paste of Ag, Au, Pd or the like; a bump; an anisotropic electrically conductive member; a brazing material such as low melting temperature metal; and the like. Particularly, the alloy that contains Ag, Cu and Sn as its main components is preferable.

Hereinafter, a method for manufacturing the light emitting device 100A according to the present embodiment will be described with reference to FIGS. 2 to 8.

Method of Manufacturing Light Emitting Device

Providing Light Emitting Element

Figure 2:
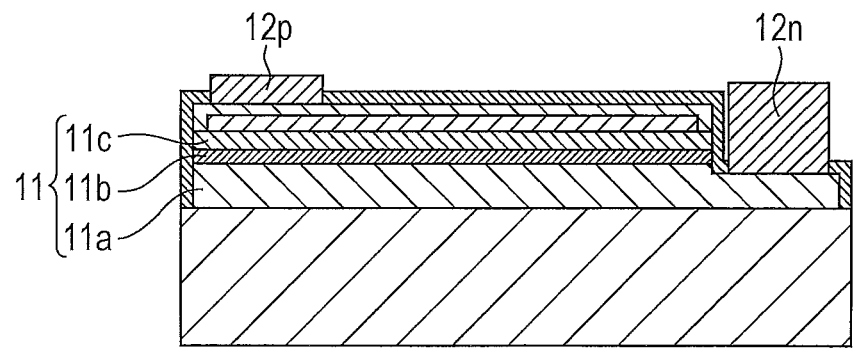
FIG. 2 is a schematic cross-sectional view illustrating a step of providing a light emitting element in a method of manufacturing the light emitting device 100A according to the first embodiment.

FIG. 2 is a schematic cross-sectional view illustrating a step of providing a light emitting element in a method of manufacturing the light emitting device 100A according to the first embodiment. In the step of providing the light emitting element, the light emitting element 10 that has the positive and negative electrodes 12 on the same surface is prepared. In the case of preparing a plurality of the light emitting elements 10, the light emitting elements 10 may be arranged at a predetermined interval on a sheet that is made of resin or the like. With this arrangement, the plurality of the light emitting elements 10 and the light-reflecting substrate 20 can be mounted at once in a step of arranging the light emitting element, so that the production efficiency can be enhanced. In the case of arranging the plurality of the light emitting elements 10 on the sheet, the light emitting elements 10 are arranged so that the surface of each of the light emitting elements 10 which is opposite to the surface thereof having the electrodes 12 may contact the sheet. Subsequently, the sheet may be removed, or may be used as a constituent member of the light emitting device 100A.

Providing Light-Reflecting Substrate

Figure 3A:
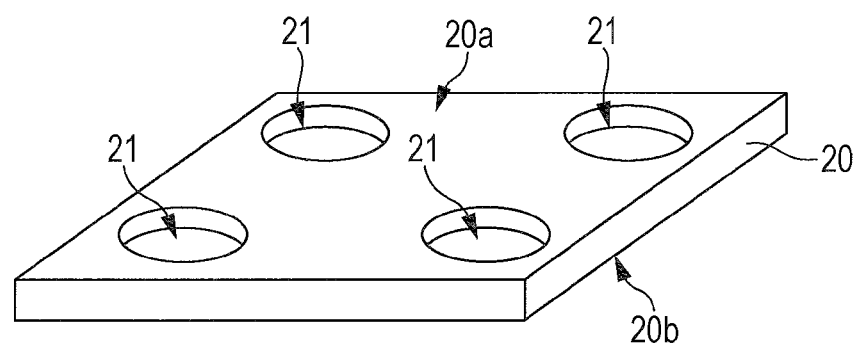
FIG. 3A is a schematic perspective view illustrating a step of providing a light-reflecting substrate in the method of manufacturing the light emitting device 100A according to the first embodiment.
Figure 3B:
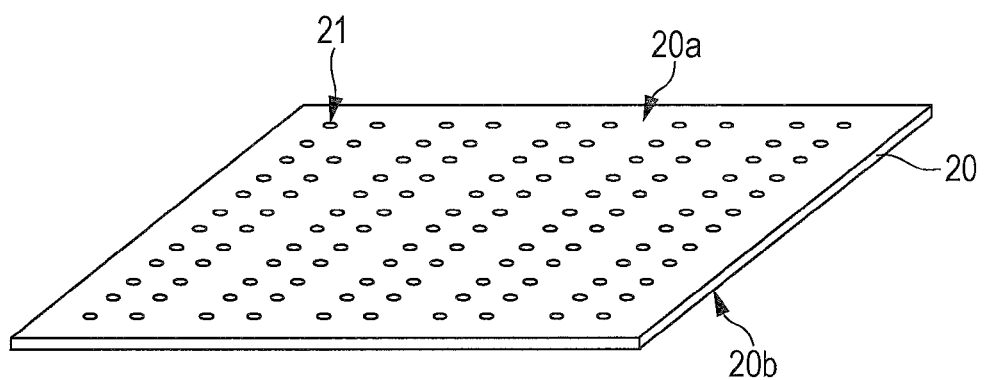
FIG. 3B is a schematic perspective view illustrating the step of providing a light-reflecting substrate in the method of manufacturing the light emitting device 100A according to the first embodiment.

FIGS. 3A and 3B are schematic perspective views illustrating a step of providing a light-reflecting substrate in the method of manufacturing the light emitting device 100A according to the first embodiment. In the step of providing the light-reflecting substrate, the light-reflecting substrate 20 that includes a first main surface 20*a*, a second main surface 20*b* opposite to the first main surface 20*a*, and holes 21 penetrating the light-reflecting substrate 20 from the first main surface 20*a* to the second main surface 20*b* at the positions correspond to the electrodes 12 of the light emitting element 10 is provided. In the case of providing a plurality of the light emitting elements 10 in the step of providing the light emitting element, a light-reflecting substrate 20 which is a collective substrate provided with a plurality of holes 21 that correspond to the respective positive and negative electrodes 12*p* and 12*n* may be provided, so that the light emitting elements 10 and the light-reflecting substrate 20 can be arranged at once in the step of arranging the light emitting element, thereby enhancing the production efficiency.

The holes 21 of the light-reflecting substrate 20 can be formed according to a shape of a mold for producing the light-reflecting substrate 20 by compression molding or transfer molding. Further, the holes 21 can be formed by punching, etching, laser beam machining or the like, after the production of the plate-shaped light-reflecting substrate 20.

The order of performing the step of providing the light emitting element and the step of providing the light-reflecting substrate may be altered appropriately according to the needs.

Arranging Light Emitting Element and Light Reflecting Substrate

Figure 4:
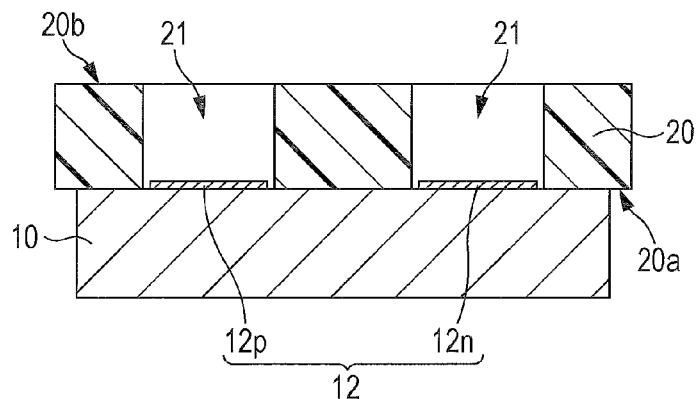
FIG. 4 is a schematic cross-sectional view illustrating a step of arranging the first surface and the first main surface in the method of manufacturing the light emitting device 100A according to the first embodiment.

FIG. 4 is a schematic cross-sectional view illustrating a step of arranging the light emitting element and the light-reflecting substrate in the method of manufacturing the light emitting device 100A according to the first embodiment. In the step of arranging the light emitting element and the light-reflecting substrate, the surface of the light emitting element 10 that has the electrodes 12 and the first main surface 20a of the light-reflecting substrate 20 are superposed facing each other so that the electrodes 12 of the light emitting element 10 are exposed from the holes 21 respectively.

More specifically, the first main surface 20a of the light-reflecting substrate 20, which is provided in the step of providing the light-reflecting substrate, is positioned so as to face the surface of the light emitting element 10 having the electrodes 12, which is provided in the step of providing the light emitting element. Thus, the first main surface 20a can be temporarily fixed by a flux or the like. Alternatively, the light emitting element 10 may be positioned and arranged on the light-reflecting substrate 20.

The flux can be arranged beforehand on the first main surface 20a of the light-reflecting substrate 20 and/or the surface of the light emitting element 10 having the electrodes 12, by way of pin transfer, with the use of a dispenser or the like. With the temporary fixing by the flux, positional displacement between the light emitting element 10 and the light-reflecting substrate 20 can be avoided.

In the step of arranging a first surface and a first main surface, it is preferable to arrange the light emitting element 10 and the light-reflecting substrate 20 so that larger areas of the electrodes 12 of the light emitting element 10 can be exposed to the insides of the holes 21 of the light-reflecting substrate 20, respectively. Thereby, the electrodes 12 can be bonded with the electrically conductive members 30 securely in a step of bonding the electrically conductive members and the electrodes. Further, it is preferable to arrange the light emitting element 10 and the light-reflecting substrate 20 so as not to generate a space therebetween. For example, it is preferable to arrange the light emitting element 10 and the light-reflecting substrate 20 so that the electrodes 12 are accommodated in the holes 21, respectively. Thereby, the steps between the semiconductor layer 11 and the electrodes 12 of the light emitting element 10 are arranged in the holes 21, whereby the light emitting element 10 and the light-reflecting substrate 20 can be arranged stably without leaving space.

Arranging Substantially Spherical Electrically Conductive Member

Figure 5:
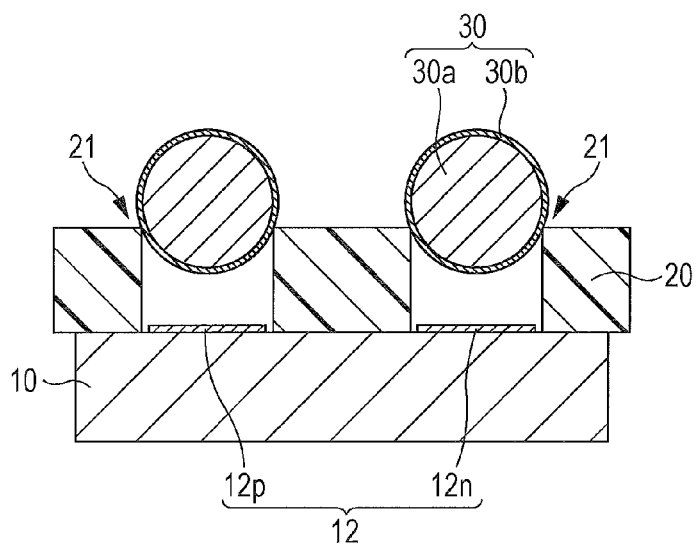
FIG. 5 is a schematic cross-sectional view illustrating a step of arranging a substantially spherical electrically conductive member in the method of manufacturing the light emitting device 100A according to the first embodiment.

FIG. 5 is a schematic cross-sectional view illustrating a step of arranging a substantially spherical electrically conductive member in the method of manufacturing the light emitting device 100A according to the first embodiment. In the step of arranging a substantially spherical electrically conductive member of the present embodiment, the substantially spherical electrically conductive members 30 that include: the substantially spherical electrically conductive members 30a; and the coating portions 30b that coat the cores 30a can be arranged in the respective holes 21 of the light-reflecting substrate 20.

For example, thicknesses of the coating portions 30b are determined depending on the sizes of the holes 21, but may range from about 1 μm to about 50 μm, and more preferably ranges from about 1 μm to about 10 μm. Thereby, in the step of bonding the electrically conductive members and the electrodes, the coating portions 30b can be filled in amounts which can connect the cores 30a with the electrodes 12 favorably and which enable the cores 30a to remain in the holes 21, respectively. The coating portions 30b can have a single layer structure or a multilayer structure as appropriate.

The electrically conductive members 30 can be arranged in the holes 21 of the light-reflecting substrate 20 by using a suction jig or the like. Other than this arrangement, the electrically conductive members 30 can be arranged in the respective holes 21, for example, by: providing a frame so as to surround an outer margin of the light-reflecting substrate 20; arranging the same number of the substantially spherical electrically conductive members 30 as the number of the holes 21 on the second main surface 20b; and shaking the light-reflecting substrate 20. Thereby, the manufacturing costs and time can be reduced.

In the step of arranging a first surface and a first main surface, the electrically conductive members 30 may be arranged so that at least a portion of each of the electrically conductive members 30 is held by the lateral surface of the corresponding hole 21. Thus, as shown in FIG. 5, the electrically conductive members 30 may not be necessarily accommodated within the holes 21. Also, the electrically conductive members 30 may not necessarily in contact with the electrodes 12 in the step of arranging a first surface and a first main surface.

At the time of arranging the electrically conductive members 30 in the respective holes 21, the use of flux or the like allows for secure holding of the electrically conductive members 30 with the lateral surfaces of the corresponding holes 21. The flux can be arranged in advance, for example, before arranging the electrically conductive members 30, in the holes 21 of the light-reflecting substrate 20 by using a method that is similar to the above-described method. Further, in the case of arranging the electrically conductive members 30 in the holes 21 by shaking the light-reflecting substrate 20, it is preferable to provide the flux by, for example, spraying or the like after the electrically conductive members 30 are arranged in the respective holes 21.

The step of arranging a substantially spherical electrically conductive member is preferably carried out after the step of arranging a first surface and a first main surface in view of the possibility of arranging the flux in the holes 21 of the light-reflecting substrate 20, and of the possibility of detachment of the electrically conductive members 30 from the holes 21 in the case where the electrically conductive members 30 are smaller than the holes 21, or the like.

Bonding Electrically Conductive Member and Electrode

Figure 6:
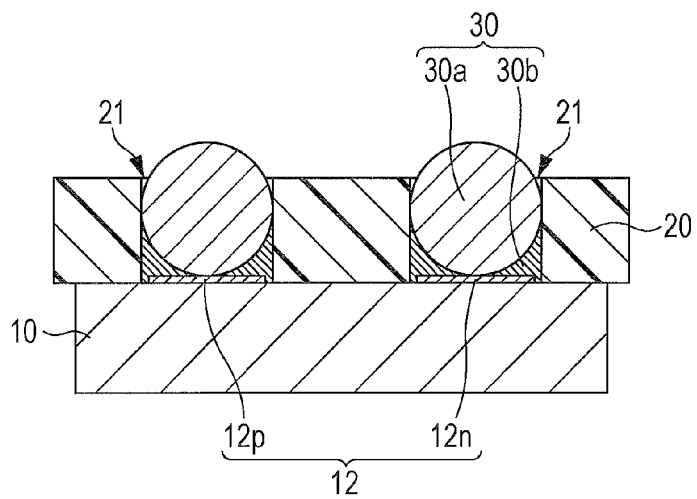
FIG. 6 is a schematic cross-sectional view illustrating a step of bonding the electrically conductive members and the electrodes in the method of manufacturing the light emitting device 100A according to the first embodiment.

FIG. 6 is a schematic cross-sectional view illustrating a step of bonding the electrically conductive members and the electrodes in the method of manufacturing the light emitting device 100A according to the first embodiment. In the step of bonding the electrically conductive members and the electrodes, the electrically conductive members 30 are bonded with the electrodes 12 of the light emitting element 10. The term "bonding" in the present specification means contacting and fixing for electrical connection.

As in the present embodiment, in the case where the electrically conductive members 30 including, the cores 30a, and the coating portions 30b which coat the cores 30a and are made of the material whose melting point is lower than that of the cores 30a are arranged in the holes 21 in the step of arranging a substantially spherical electrically conductive member, the coating portions 30b are melted by being heated at the melting point of the coating portions 30b or higher, so that the electrically conductive members 30 can be bonded with the electrodes 12 in the step of bonding the electrically conductive members and the electrodes. More specifically, the coating portions 30b are melted by heat, and the cores 30a are caused to sink by its own weight so as to contact the electrodes 12. The melted coating portions 30b are filled in the holes 21 so as to embed the spaces between the lateral surface 22 defining the holes 21 and the cores 30a, respectively. The coating portions 30b are cooled off and solidified in this state, whereby the electrically conductive members 30 (more specifically, the cores 30a) can be bonded with the electrodes 12.

As described above, if the cores 30a are bonded with the electrodes 12 in the state where the cores 30a contact the lateral surface 22 defining the holes 21, the light emitting device 100A in which the light-reflecting substrate 20 is hardly detached and the members adhere to each other tightly can be produced. Further, it is preferable that the cores 30a are substantially spherical and the lateral surface 22 defining the holes 21 are substantially planar, because the resistance for the cores 30a to move toward the electrodes 12 can be reduced as described above, and thus, the cores 30a can contact the electrodes 12 easily.

In the case where there is the space between the light emitting element 10 and the light-reflecting substrate 20, the melted coating portion 30b is arranged also in the space, but such arrangement is acceptable, unless the coating portion 30b that is connected electrically with either the positive or negative electrode 12 is connected electrically with the other electrode 12.

As described above, the explanation of the form of completing the electrically conductive members 30 by using the substantially spherical electrically conductive members 30 in which the substantially spherical cores 30a are coated with the coating portions 30b has been provided, but the electrically conductive members 30 may be produced by supplying and arranging the cores 30a and the coating portions 30b separately as follows. More specifically, the substantially spherical cores 30a are firstly arranged so as to contact the electrodes 12 that are exposed in the holes 21. Thereafter, each of the coating portions 30b in a melted or liquid state is filled in the space between the core 30a and the lateral surface 22 of the hole 21 by allowing it to drip into the space or by using a desired method such as printing. Then, the coating portions 30b are cured, compliting the electrically conductive members 30.

Light-Transmissive Member Forming Step

Figure 7:
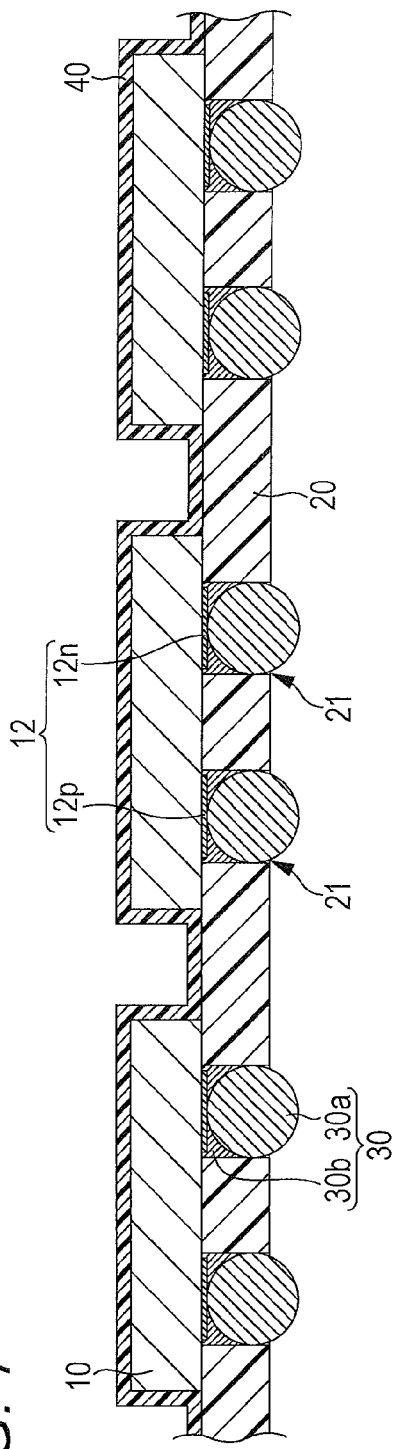
FIG. 7 is a schematic cross-sectional view illustrating a step of forming a light-transmissive member in the method of manufacturing the light emitting device 100A according to the first embodiment.

FIG. 7 is a schematic cross-sectional view illustrating a light-transmissive member forming step in the method of manufacturing the light emitting device 100A according to the first embodiment. In the present embodiment, the light-transmissive member forming step of forming the light-transmissive member 40 on the surfaces of the light emitting element 10 from which light of the light emitting element 10 is taken out may be carried out as appropriate. The light-transmissive member 40 can be formed by, for example, spraying, a dropping method, printing, compression molding, transfer molding or the like. Other than these, the light-transmissive member 40 can be formed by electrode-position, or the light-transmissive member 40 made of glass, a resin sheet or the like which is prepared in advance may be arranged.

Singulating

Figure 8:
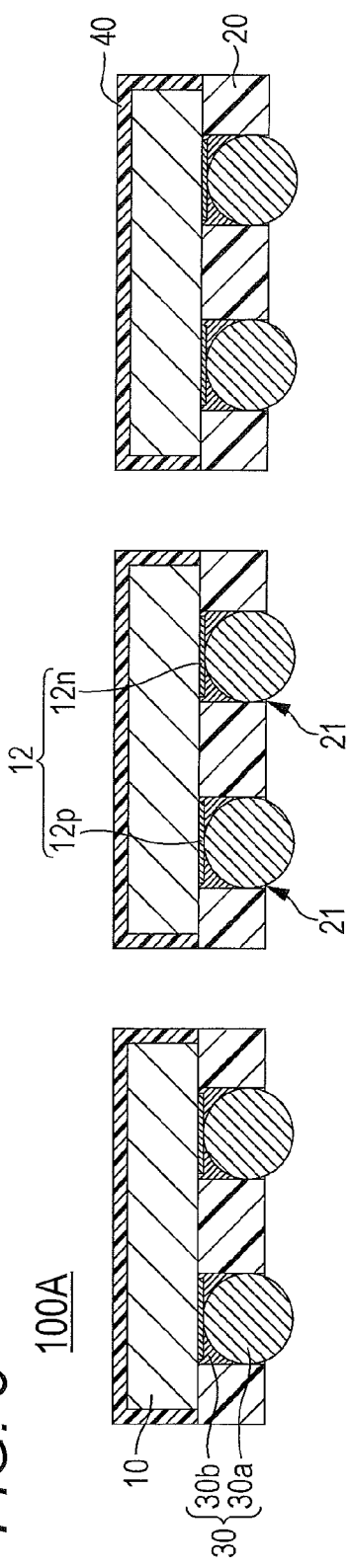
FIG. 8 is a schematic cross-sectional view illustrating a step of sigulating in the method of manufacturing the light emitting device 100A according to the first embodiment.

FIG. 8 is a schematic cross-sectional view illustrating a step of singulating in the method of manufacturing the light emitting device 100A according to the first embodiment. In the case of using the aggregate substrate that is the light-reflecting substrate 20, the step of singulating the light-reflecting substrate 20 into individual light emitting devices 100A may be carried out. More specifically, the light-reflecting substrate 20 can be cut off for each of the light emitting element 10 or each group of the light emitting elements 10 by dicing or the like. In the present embodiment, for example, the light-reflecting substrate 20 can be individualized so that the light-transmissive member 40 which coats the side surfaces of the light emitting element 10 and the light-reflecting substrate 20 may constitute substantially the same face. Thereby, the light emitting device 100A shown in FIG. 1 can be produced. The individualizing step may be carried out either before or after the light-transmissive member forming step, but is preferably carried out after the light-transmissive member forming step because the production efficiency is improved.

In the individualizing step, by individualizing the light-reflecting substrate 20 so as to expose the electrically conductive members 30 (the cores 30a) from the side surface of the light-reflecting substrate 20, the side-view light emitting device can be produced.

According to the method for manufacturing the light emitting device 100A having the above-described steps, the small-sized light emitting device 100A with the high reliability can be manufactured easily at the high production efficiency. The manufacturing method may not necessarily include the light-transmissive member forming step or the individualizing step, and may include other step as appropriate.

Second Embodiment

Figure 10:
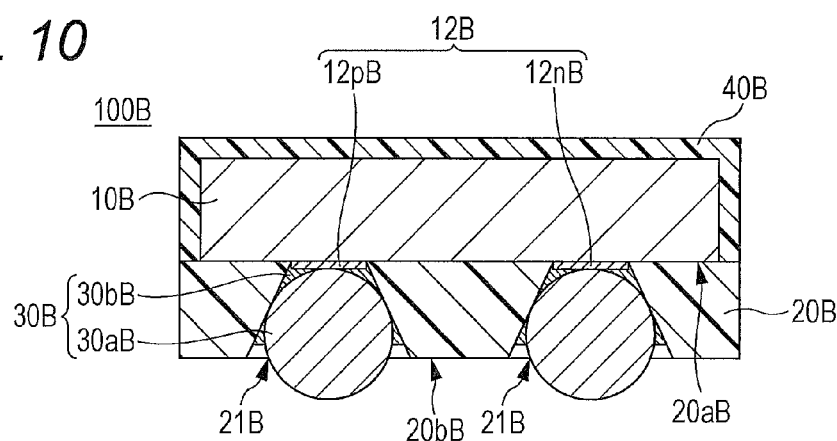
FIG. 10 is a schematic cross-sectional view illustrating a light emitting device 100B according to a second embodiment.

FIG. 10 is a schematic cross-sectional view illustrating a light emitting device 100B according to a second embodiment. In the light emitting device 100B, opening diameters of holes 21B of a light-reflecting substrate 20B in a first main surface 20aB and on a second main surface 20bB are different from each other. In the present embodiment, the opening diameters of the holes 21B in the second main surface 20bB are equal to or larger than diameters of cores 30aB, and the opening diameters of the holes 21B in the first main surface 20aB are smaller than the diameters of the cores 30aB. More specifically, the side surface of each of the holes 21B has a tapered shape narrowing from the second main surface 20bB toward the first main surface 20aB. That is, lateral surface 22B of the holes 21B are inclined so that the holes 21B may be narrower from the second main surface 20bB toward the first main surface 20aB. In the case where the opening diameters of the holes 21B in the second main surface 20bB are equal to or larger than the diameters of the cores 30aB, and the opening diameters of the holes 21B in the first main surface 20aB are smaller than the diameters of the cores 30aB, the lateral surface 22B of the holes 21B may not be necessarily inclined.

Except for the above-described structures, the light emitting device 100B has a configuration that is substantially similar to the configuration of the light emitting device 100A of the first embodiment.

According to such a configuration, since the opening diameters of the holes 21B in the first main surface 20aB are smaller than the diameters of the cores 30aB, the light-reflecting substrate 20B is fixed by the cores 30aB that are bonded with the light emitting element 10B, whereby the light-reflecting substrate 20B is not detached. Therefore, the light emitting device 100B in which the members adhere to each other tightly can be produced.

Third Embodiment

Figure 11:
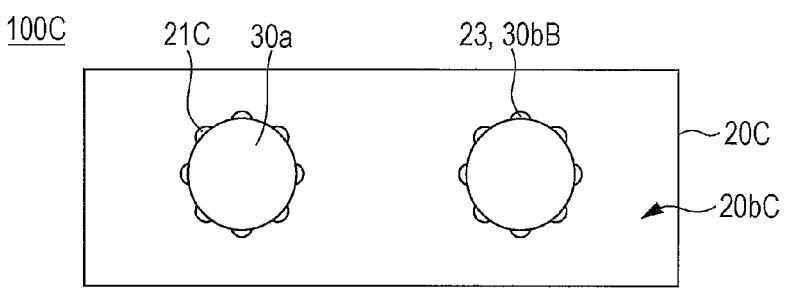
FIG. 11 is a schematic plan view of a light emitting device 100C according to a third embodiment, which is seen from a mounting side.

FIG. 11 is a plan view of a light emitting device 100C according to a third embodiment, which is seen from a side of a second main surface 20bC of a light-reflecting substrate 20C. The light emitting device 100C has irregularities 23 on the lateral surfaces 22C the holes 21C in the light-reflecting substrate 20C, and recessed portions of the irregularities 23 are filled with coating portions 30bC of electrically conductive members 30C.

The irregularities 23 can be provided, for example, according to a shape of a mold for forming holes by punching a flat-plate light-reflecting substrate. The light emitting device 100C has a configuration which is substantially similar to the configuration of the light emitting device 100A of the first embodiment except that the lateral surface 22C of the holes 21C have the irregularities 23.

According to such a configuration, unification of: the light emitting element 10C; the electrically conductive members 30C; and the light-reflecting substrate 20C can be improved. Particularly, in the case where the holes 21C are substantially cylindrical or substantially conic, and the substantially spherical cores 30aC contact the lateral surfaces 22C of the holes 21C (that is, each of the cores 30aC and each of the lateral surface 22C share a plane where they contact each other without leaving space in the cross-sectional view that is taken along a planar direction), each of the coating portions 30bC is vertically sectioned by the part where each of the cores 30aC contact each of the lateral surfaces 22C, so that the electrically conductive members 30C are likely to be detached from the light-reflecting substrate 20C. However, since the lateral surfaces 22C that contact the cores 30aC have the irregularities 23, the coating portions 30bC are unified with the cores 30aC, and bonding areas between the cores 30aC and the coating portions 30bC are increased, whereby the electrically conductive members 30C can be prevented from being detached from the light-reflecting substrate 20C. Accordingly, the unification of: the light emitting element 10C; the electrically conductive members 30C; and the light-reflecting substrate 20C can be strengthened.

The irregularities 23 may be of microscopic size which are produced in the formation of the holes 21C.

Fourth Embodiment

Figure 12A:
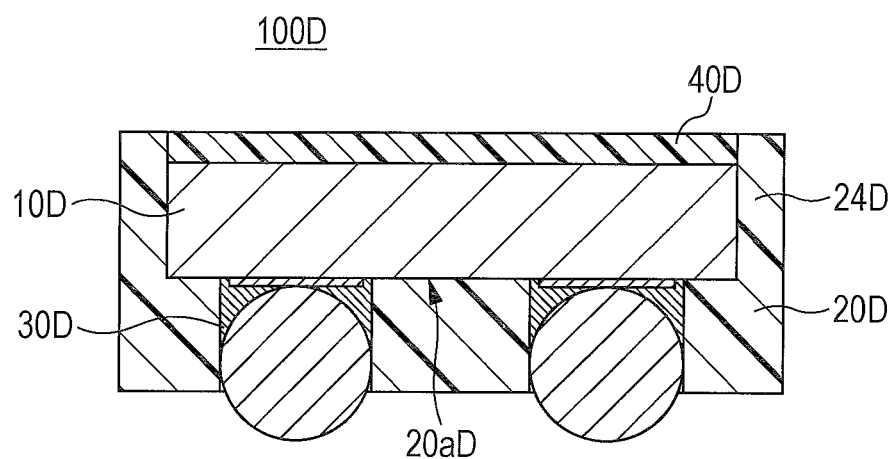
FIG. 12A is a schematic cross-sectional view illustrating a light emitting device 100D according to a fourth embodiment.
Figure 12B:
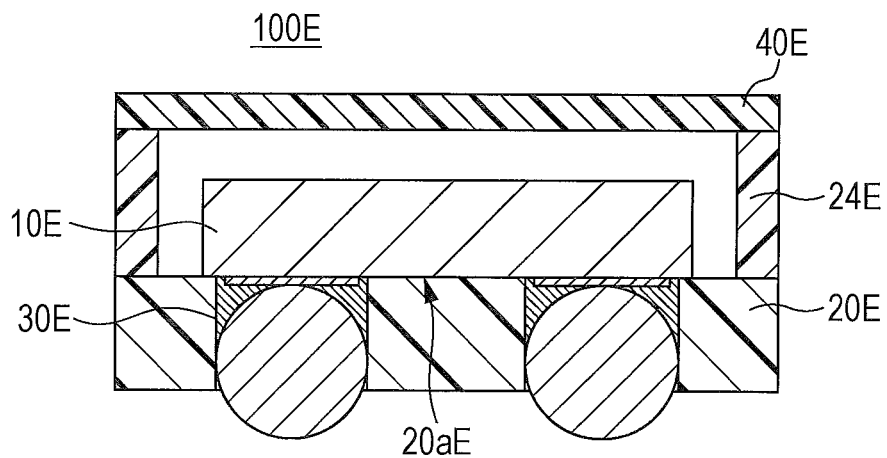
FIG. 12B is a schematic cross-sectional view illustrating a light emitting device 100E according to the fourth embodiment.

FIG. 12A is a schematic cross-sectional view illustrating a light emitting device 100D according to a fourth embodiment. FIG. 12B is a schematic cross-sectional view illustrating a light emitting device 100E according to the fourth embodiment. The light emitting devices 100D and 100E of the fourth embodiment have frame bodies 24D and 24E that surround light emitting elements 10D and 10E on first main surfaces 20aD and 20aE of light-reflecting substrates 20D and 20E, respectively. Except for the above-described structures, the light emitting devices 100D and 100E have configurations that are substantially similar to the configuration of the light emitting device 100A of the first embodiment.

More specifically, the light emitting device 100D shown in FIG. 12A has a light-transmissive member 40D on a surface (an upper surface) of the light emitting element 10D from which light of the light emitting element 10D is taken out, and the frame body 24D of the light-reflecting substrate 20D is arranged so as to coat side surfaces of the light emitting element 10D and side surfaces of the light-transmissive member 40D. An upper surface of the light-transmissive member 40D and an upper surface of the light-reflecting substrate 20D are provided so as to constitute substantially the same face. According to such a configuration, the light emitting device 100D with high visibility can be produced. The expression "high visibility" as used herein refers to an emission with high directivity in the emitting direction.

The light emitting device 100E shown in FIG. 12B is provided with a light-transmissive member 40E on an upper surface of the frame body 24E of the light-reflecting substrate 20E that surrounds the light emitting element 10E. The frame body 24E is positioned to be higher than a surface (an upper surface) of the light emitting element 10E from which light of the light emitting element 10E is taken out, and the light emitting element 10E and the light-transmissive member 40E are separated from each other. According to such a configuration, the light emitting device 100E that generates less color unevenness due to the directivity can be produced.

The frame bodies 24D and 24E of the light-reflecting substrates 20D and 20E can be provided, for example, according to a shape of a mold for forming the light-reflecting substrate. Also, the frame bodies 24D and 24E may be formed by drawing with a resin or the like that contains a light-reflecting material, or may be formed by positioning the lattice-shaped frame bodies 24D and 24E, which are prepared in advance, so as to surround the light emitting elements 10D and 10E, and allowing the frame bodies 24D and 24E to adhere onto the first main surfaces 20aD and 20aE of the light-reflecting substrates 20D and 20E via an adhesive member or the like, respectively.

Hereinafter, an example of the light emitting device 100B according to the second embodiment will be described in detail by way of the drawings.

Example

The light emitting device 100B according to a present example is a surface-mounted light emitting device having a size of about 1.0 mm×about 1.0 mm in a plan view and a height of about 0.3 mm. The light emitting device 100B of the present example has the one light emitting element 10B. The light emitting element 10B has a substantially rectangular parallelepiped shape with a square shape of about 0.95 mm×about 0.95 mm in a plan view and a height of about 0.15 mm, and includes positive and negative electrodes 12pB and 12nB on a same surface thereof. The electrodes 12pB and 12nB respectively have a substantially circular shape with a diameter of about 0.09 mm in a plan view, and are spaced apart from each other at a distance of about 0.75 mm between centers of the electrodes 12pB and 12nB.

The light-reflecting substrate 20B is made of modified epoxy resin that contained titanium dioxide, and has: the first main surface 20aB; and the second main surface 20bB that is opposite to the first main surface 20aB. The light-reflecting substrate 20B has a size of about 1.0 mm×about 1.0 mm in a plan view and a height of about 0.1 mm, and includes holes 21B which penetrate the light-reflecting substrate 20B from the first main surface 20aB to the second main surface 20bB at positions that correspond to the electrodes 12B. The contours of the openings of the holes 21B of the present example have a substantially square shape.

The surface of the light emitting element 10B having the electrodes 12B and the first main surface 20aB of the light-reflecting substrate 20B are arranged facing each other so that the electrodes 12B may be exposed i the respective holes 21B. Opening diameters of the holes 21B on the first main surface 20aB are about 0.1 mm×0.1 mm, and opening diameters of the holes 21B on the second main surface 20bB are about 0.137 mm×about 0.137 mm. A separation distance between centers of the holes 21B on the first main surface 20aB is about 0.75 mm in a plan view, and the electrodes 12B of the light emitting element 10B are stored in the holes 21B, respectively. The holes 21B have the tapered shapes narrowing from the second main surface 20bB toward the first main surface 20aB, and inclination angles of the lateral surfaces 22B of the holes 21B are about 21°.

The cores 30aB are made of Cu, and diameters thereof are about 0.12 mm. The cores 30aB are bonded with the electrodes 12B in the holes 21B, and contact the lateral surfaces 22B of the holes 21B, respectively.

Further, the cores 30aB protrude from the second main surface 20bB of the light-reflecting substrate 20B by only about 0.02 mm. The coating portions 30bB are made of alloy of Sn, Ag and Cu, and are filled in the holes 21B so as to fill the spaces between the lateral surfaces 22B of the holes 21B and the cores 30aB. For example, the coating portions 30bB are filled to levels that are lower than the second main surfaces 20bB by only about 0.05 mm, respectively.

Moreover, the light emitting device 100B of the present example is provided with a light-transmissive member 40B. The light-transmissive member 40B is made of, for example, silicone resin that contains a phosphor, and is formed to have a film thickness of about 0.03 mm on the surfaces of the light emitting element 10B except for the surface having the electrodes 12B.

According to the above-described configuration, the small-sized light emitting device 100B having the high reliability can be manufactured easily with the high production efficiency. In addition, the opening diameters of the holes 21B at the first main surface 20aB are smaller than the diameters of the cores 30aB, and the side surface of the holes 21B is tapered narrowing from the second main surface 20bB toward the first main surface 20aB, the light emitting device 100B can be formed such that the light-reflecting substrate 20B is hardly detached from the light emitting element 10B which is bonded with the cores 30aB.

Furthermore, the light emitting device 100B can be structured such that the electrically conductive members 30B are hardly detached from the light-reflecting substrate 20B.

A light emitting device according to the embodiments of the present invention includes: a light emitting element having a positive electrode and a negative electrode on a same surface; a light-reflecting substrate including a first main surface that faces the surface having the electrodes, a second main surface that is opposite to the first main surface, and holes which penetrate the light-reflecting substrate from the first main surface to the second main surface at positions that correspond to the electrodes; and electrically conductive members including substantially spherical cores that are arranged in the holes and are bonded with the electrodes, and coating portions that are filled in the spaces between the cores and the lateral surfaces of the holes.

A method for manufacturing a light emitting device according to the embodiments of the present invention includes, a step of providing a light emitting element which has a positive electrode and a negative electrode on a same surface, a step of providing a light-reflecting substrate which includes a first main surface, a second main surface that is opposite to the first main surface and holes which penetrate the light-reflecting substrate from the first main surface to the second main surface at positions that correspond to the electrodes, a step of arranging a first surface having the electrodes and the first main surface so that the electrodes may be exposed from the holes, a step of arranging substantially spherical electrically conductive members in the holes, and a step of bonding the electrically conductive members and the electrodes.

The embodiments of the present invention can provide the small-sized light emitting device with high production efficiency.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
a light emitting element including a first surface and an electrode provided on the first surface;
a light-reflecting substrate having a first main surface facing the first surface of the light emitting element and having a second main surface opposite to the first main surface, the light-reflecting substrate having an inner circumferential surface defining a hole at a position corresponding to the electrode, the hole penetrating through the light-reflecting substrate from the first main surface to the second main surface; and
an electrically conductive member including a substantially spherical core arranged in the hole and bonded with the electrode, and a coating portion provided in a space between the substantially spherical core and the inner circumferential surface, a center of the substantially spherical core being provided between the first main surface and the second main surface,
wherein the inner circumferential surface has an irregularity.

2. The light emitting device according to claim 1,
wherein an opening diameter of the hole on the second main surface is equal to or larger than a diameter of the substantially spherical core, and
wherein an opening diameter of the hole on the first main surface is smaller than the diameter of the substantially spherical core.

3. The light emitting device according to claim 1,
wherein the hole has a tapered shape narrowing from the second main surface toward the first main surface.

4. The light emitting device according to claim 1,
wherein the substantially spherical core contacts the inner circumferential surface.

5. The light emitting device according to claim 1,
wherein the substantially spherical core protrudes from the second main surface.

6. The light emitting device according to claim 1,
wherein, in a plan view, the electrode is accommodated within the hole.

7. The light emitting device according to claim 1,
wherein a melting point of the coating portion is lower than a melting point of the substantially spherical core.

8. The light emitting device according to claim 1,
wherein the substantially spherical core contains Cu, and
wherein the coating portion is made of alloy that contains Au and at least one kind among Si, Ge, and Sn.

9. The light emitting device according to claim 1, further comprising:
a second electrically conductive member comprising:
a second substantially spherical core; and
a second coating portion, wherein the electrode of the light emitting element is a positive electrode, wherein the light emitting element has a negative electrode provided on the first surface, wherein the light-reflecting substrate has an additional inner circumferential surface defining a second hole penetrating from the first main surface to the second main surface of the light-reflecting substrate at a location corresponding to the negative electrode, wherein the second substantially spherical core is provided in the second hole to be bonded with the negative electrode, and wherein the second coating portion is provided in a second space between the second substantially spherical core and the additional inner circumferential surface.

10. The light emitting device according to claim 2, wherein the substantially spherical core contacts the inner circumferential surface.

11. The light emitting device according to claim 3, wherein the substantially spherical core contacts the inner circumferential surface.

12. The light emitting device according to claim 2, wherein the substantially spherical core has a circumference around a line connecting the center of the substantially spherical core and an electrode contact point at which the substantially spherical core contacts the electrode, and wherein the circumference contacts the inner circumferential surface.

13. The light emitting device according to claim 3, wherein the substantially spherical core has a circumference around a line connecting the center of the substantially spherical core and an electrode contact point at which the substantially spherical core contacts the electrode, and wherein the circumference directly contacts the inner circumferential surface.

14. The light emitting device according to claim 1, wherein the irregularity includes a projection and a recessed portion recessed from the projection, wherein the substantially spherical core has a circumference around a line connecting the center of the substantially spherical core and an electrode contact point at which the substantially spherical core contacts the electrode, and wherein the circumference contacts the projection to provide a gap between the circumference and the recessed portion in a radial direction substantially perpendicular to the line, the coating portion being provided in the gap.

* * * * *